United States Patent
Kobayashi et al.

(10) Patent No.: US 10,901,057 B2
(45) Date of Patent: Jan. 26, 2021

(54) MAGNETIC RESONANCE IMAGING APPARATUS

(71) Applicant: Toshiba Medical Systems Corporation, Otawara (JP)

(72) Inventors: Takahiro Kobayashi, Otawara (JP); Kazuyuki Soejima, Otawara (JP); Sojiyuuro Kato, Yokohama (JP); Haruki Nakamura, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 269 days.

(21) Appl. No.: 15/665,887

(22) Filed: Aug. 1, 2017

(65) Prior Publication Data

US 2018/0031658 A1 Feb. 1, 2018

(30) Foreign Application Priority Data

Aug. 1, 2016 (JP) .................................. 2016-151458

(51) Int. Cl.
*G01R 33/54* (2006.01)
*G01R 33/56* (2006.01)

(52) U.S. Cl.
CPC ......... *G01R 33/54* (2013.01); *G01R 33/5608* (2013.01)

(58) Field of Classification Search
CPC ............................ G01R 33/36; G01R 33/3607; G01R 33/3614; G01R 33/54; G01R 33/543; G01R 33/546; G01R 33/5608; G01R 33/561
USPC .................................. 324/309, 314, 318, 322
See application file for complete search history.

(56) References Cited

U.S. PATENT DOCUMENTS

| | | | | |
|---|---|---|---|---|
| 4,689,779 A | * | 8/1987 | Hayashi | G11B 21/106 369/44.32 |
| 4,742,302 A | * | 5/1988 | Breton | G01R 33/446 324/307 |
| 4,763,075 A | * | 8/1988 | Weigert | A61B 5/04282 324/318 |
| 5,150,053 A | * | 9/1992 | Pauly | G01R 33/446 324/307 |
| 5,821,752 A | * | 10/1998 | LeRoux | G01R 33/446 324/314 |
| 6,188,219 B1 | * | 2/2001 | Reeder | G01R 33/58 324/307 |
| 6,259,253 B1 | * | 7/2001 | Ellingson | G01R 33/3621 324/322 |

(Continued)

FOREIGN PATENT DOCUMENTS

JP 3452395 9/2003

*Primary Examiner* — Steven L Yeninas
(74) *Attorney, Agent, or Firm* — Oblon, McClelland, Maier & Neustadt, L.L.P.

(57) ABSTRACT

A magnetic resonance imaging apparatus according to an embodiment includes first generating circuitry and second generating circuitry. The first generating circuitry interpolates a first data string of digital data including envelope information of a radio frequency (RF) pulse to be output, thereby generating a second data string in which a variation amount of digital data adjacent to each other in the first data string is smaller than an upper limit value. The second generating circuitry generates a signal of the RF pulse by combining the second data string generated by the first generating circuitry and information relating to a carrier wave of the RF pulse, and outputs the signal to an RF amplifier.

10 Claims, 9 Drawing Sheets

(56) References Cited

U.S. PATENT DOCUMENTS

| | | | |
|---|---|---|---|
| 6,411,093 B2* | 6/2002 | Schwilch | G01R 33/3607 324/300 |
| 6,636,038 B1* | 10/2003 | Heid | G01R 33/54 324/307 |
| 7,504,828 B2* | 3/2009 | Kagami | G01R 33/3607 324/318 |
| 7,924,004 B2* | 4/2011 | Prance | G01R 33/323 324/307 |
| 2005/0001617 A1* | 1/2005 | Busse | G01R 33/5613 324/307 |
| 2006/0090632 A1* | 5/2006 | Ludwig | G10H 1/348 84/645 |
| 2006/0255807 A1* | 11/2006 | McBride | G01R 33/3852 324/322 |
| 2006/0262938 A1* | 11/2006 | Gauger, Jr. | G10L 21/02 381/56 |
| 2008/0284439 A1* | 11/2008 | Xu | A61B 5/055 324/322 |
| 2010/0141257 A1* | 6/2010 | Graesslin | G01R 33/3607 324/314 |
| 2011/0074414 A1* | 3/2011 | Chantz | G01R 33/3808 324/309 |
| 2013/0187622 A1* | 7/2013 | Kreischer | G05F 1/14 323/255 |
| 2015/0195118 A1* | 7/2015 | Yan | H04B 1/0475 375/297 |
| 2015/0260817 A1* | 9/2015 | Grodzki | G01R 33/543 324/309 |
| 2015/0301131 A1* | 10/2015 | Hardy | G01R 33/4833 324/309 |
| 2017/0010340 A1* | 1/2017 | Eichner | G01R 33/288 |
| 2017/0346620 A1* | 11/2017 | Bucci | H04L 25/03006 |

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2016-151458, filed on Aug. 1, 2016; the entire contents of which are incorporated herein by reference.

FIELD

Embodiments described herein relate generally to a magnetic resonance imaging apparatus.

BACKGROUND

In magnetic resonance imaging apparatuses, to generate a radio frequency (RF) pulse, a transmission technique such as a direct digital synthesizer (DDS) can be used. In such a case, digital data relating to an envelope of an RF pulse be output is first generated at predetermined time intervals (for example, 1 microsecond (µs) intervals, or the like) determined by a frequency band of a baseband of the RF pulse, and the RF pulse is then generated based on the generated digital data of the predetermined time intervals.

However, when a pulse with a high baseband frequency, in other words, a pulse a value which varies significantly in a short period, such as that of ultrashort echo time (UTE), is to be generated by using the DDS, each peak value of the digital data described above increases, and the slew rate increases. When an RF having a high slew rate is input to an RF amplifier, an output of the RF pulse increases due to transient phenomenon, and a load on the RF amplifier increases.

DETAILED DESCRIPTION

A magnetic resonance imaging apparatus according to an embodiment includes first generating circuitry and second generating circuitry. The first generating circuitry interpolates a first data string that is a digital data string including envelope information of an radio frequency (RF) pulse to be output, thereby generating a second data string in which a variation amount of digital data adjacent to each other in the first data string is smaller than an upper limit value. The second generating circuitry generates a signal of an RF pulse signal by combining the second data string generated by the first generating circuitry and information relating to a carrier wave of the RF pulse, and outputs the signal to the RF amplifier.

The magnetic resonance imaging apparatus according to the embodiment is explained in detail below by using the accompanying drawings.

First Embodiment

Figure 1:
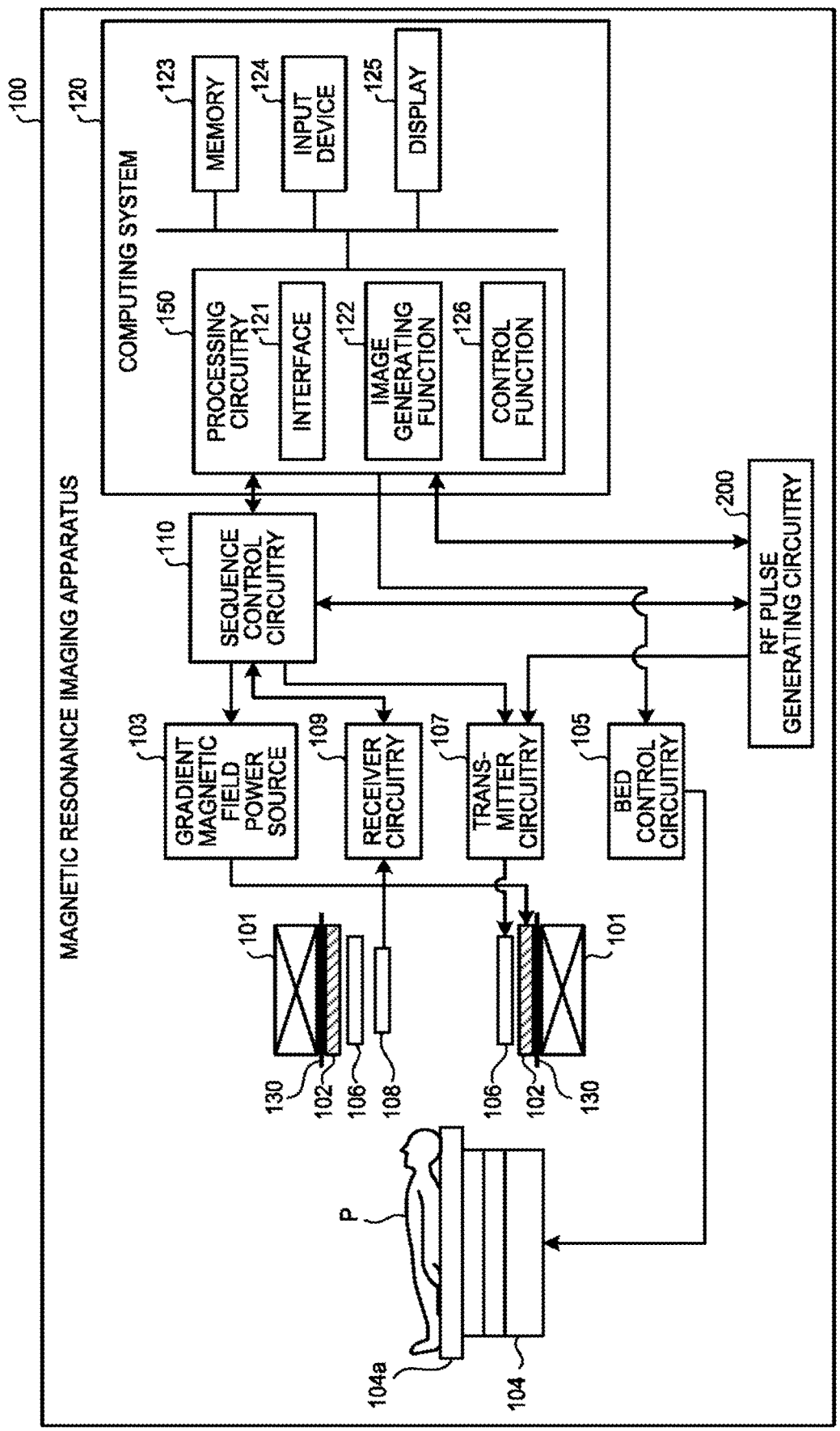
FIG. 1 is a block diagram showing a configuration of a magnetic resonance imaging apparatus according to an embodiment.
Figure 2:
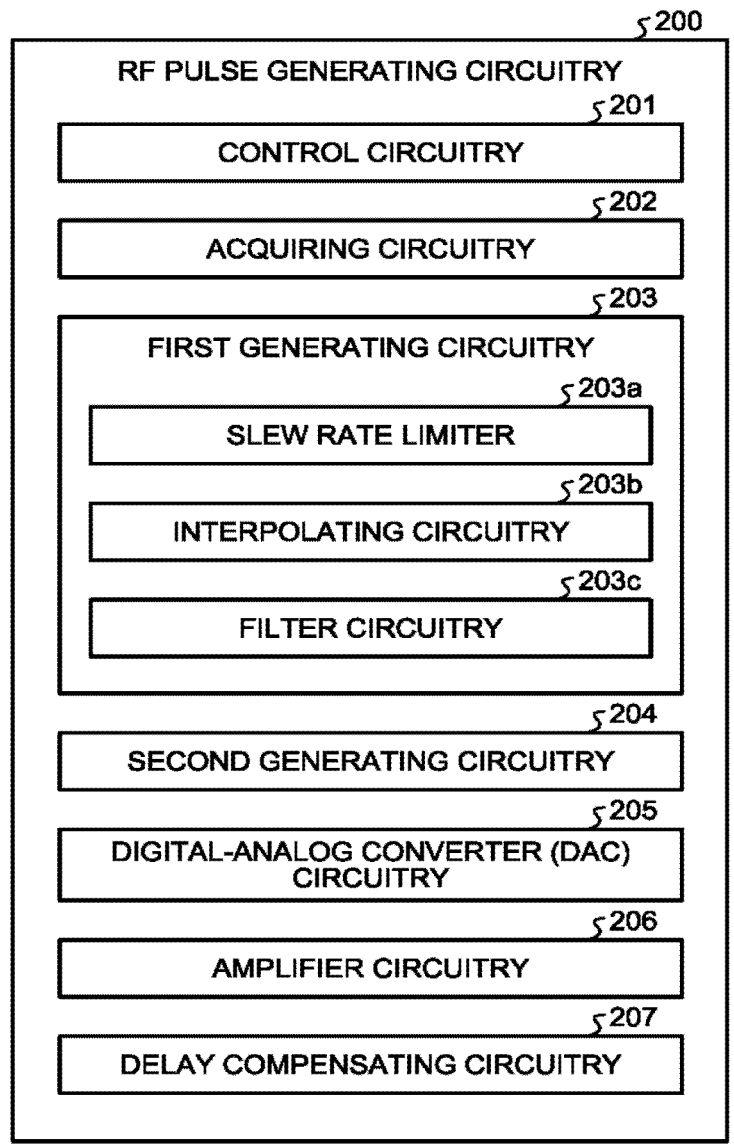
FIG. 2 is a block diagram showing a configuration of RF pulse generating circuitry according to the embodiment.

An overall configuration of a magnetic resonance imaging apparatus according to a first embodiment is explained by using FIG. 1 and FIG. 2. FIG. 1 is a block diagram showing a configuration of the magnetic resonance imaging apparatus according to the first embodiment. FIG. 2 is a block diagram showing a configuration of RF pulse generating circuitry according to the embodiment. That is, FIG. 2 explains RF pulse generating circuitry 200 shown in FIG. 1 in more details.

As shown in FIG. 1, a magnetic resonance imaging apparatus 100 includes a static magnetic field magnet 101, a shim coil 130, a gradient magnetic field coil 102, a gradient magnetic field power source 103, a bed 104, bed control circuitry 105, a transmitter coil 106, transmitter circuitry 107, a receiver coil 108, receiver circuitry 109, sequence control circuitry 110, a computing system 120, and RF pulse generating circuitry 200. A subject P (for example, a human body) is not included in the magnetic resonance imaging apparatus 100.

The static magnetic field magnet 101 is a magnet formed into a hollow cylindrical shape, and generates a uniform static magnetic field in an inner space. The static magnetic field magnet 101 is, for example, a permanent magnet, a superconductive magnet, or the like.

The shim coil 130 is a coil formed into a hollow cylindrical shape inside the static magnetic field magnet 101, and is connected to a shim coil power source not shown, and equalizes a static magnetic field generated by the static magnetic field magnet 101, by the power supplied by the shim coil power source.

The gradient magnetic field coil 102 is a coil formed into a hollow cylindrical shape, and is arranged inside the static magnetic field magnet 101 and the shim coil 130. As shown in FIG. 2, the gradient magnetic field coil 102 is formed by combining three coils (an X-axis gradient magnetic field coil 102x, a Y-axis gradient magnetic field coil 102y, a Z-axis gradient magnetic field coil 102z) corresponding to respective axes of X, Y, and Z that are perpendicular to each other. These three coils generate a gradient magnetic field, the magnetic field intensity of which vary along the respective axes of X, Y, and Z, receiving a supply of an electric current separately from the gradient magnetic field power source 103. The Z-axis direction is the same direction as the static magnetic field. Moreover, the Y-axis direction is a vertical direction, and the X-axis direction is a direction perpendicular to the Z axis and the Y axis.

The gradient magnetic fields of the respective axes of X, Y, and Z generated by the gradient magnetic field coil 102 forms, for example, a gradient magnetic field for slice selection Gs, a gradient magnetic field for phase encoding Ge, and a gradient magnetic field for readout Gr. The gradient magnetic field for slice selection Gs is used to determine an imaging section arbitrarily. The gradient magnetic field for phase encoding Ge is used to change a phase of an MR signal according to a spatial position. The magnetic field for readout Gr is used to change a frequency of an MR signal according to a spatial position.

The gradient magnetic field power source 103 supplies an electric current to the gradient magnetic field coil 102.

The bed 104 includes a top panel 104a on which the subject P is placed, and inserts the top panel 104a to the inside of an imaging opening in a state in which the subject P is placed thereon, under control by the bed control circuitry 105. Generally, the bed 104 is arranged such that a direction of length thereof is parallel to a center axis of the static magnetic field magnet 101. The bed control circuitry 105 drives the bed 104 under control by the computing system 120 and moves the top plate 104a in the longitudinal direction and the vertical direction.

The transmitter coil 106 is arranged inside the gradient magnetic field coil 102, and generates a high frequency magnetic field by receiving a supply of an RF pulse from the transmitter circuitry 107. The transmitter circuitry 107 provides an RF pulse corresponding to a Larmor frequency that is determined based on a type of a target nucleus and the intensity of magnetic field to the transmitter coil 106.

The receiver coil 108 is arranged inside the gradient magnetic field coil 102, and receive an MR signal that is radiated from the subject P by an influence of the high frequency magnetic field. Receiving the MR signal, the receiver coil 108 outputs the received MR signal to the receiver circuitry 109. For example, the receiver coil 108 is a it array having at least one, typically, more than one coil element.

The receiver circuitry 109 generates MR data based on the MR signal output from the receiver coil 108. Specifically, the receiver circuitry 109 subjects the MR signal output from the receiver coil 108 to various kinds of signal processing, such as head amplification, intermediate frequency conversion, phase detection, low frequency amplification, and filtering, and then analog-digital converts the data subjected to the various kinds of signal processing. Thus, the receiver circuitry 109 generates the MR data, which is digitalized complex data. The MR data generated by the receiver circuitry 109 is also called raw data.

Furthermore, the receiver circuitry 109 transmits the generated MR data to the sequence control circuitry 110. The receiver circuitry 109 can be arranged on a base unit side on which the static magnetic field magnet 101, the gradient magnetic field coil 102, and the like are arranged.

In the first embodiment, the MR signal output from each coil element of the receiver coil 108 is output to the receiver circuitry 109 in a unit called channel, and the like, by being distributed and combined as appropriate. Therefore, the MR data is processed per channel in processing in a subsequent stage to the receiver circuitry 109.

The total number of coil elements and the total number of channels can have a relationship that the numbers are the same, that the total number of channels is smaller than that total number of coil elements, or contrarily, that the total number of channels is larger than the total number of coil elements. The distribution and combination are not limited to be performed at the timing described above. The MR signal or the MR data can be distributed and combined per channel any time before processing by an image generating function 122 described later.

The sequence control circuitry 110 drives the gradient magnetic field power source 103, the transmitter circuitry 107, and the receiver circuitry 109 based on imaging sequence information that is transmitted from the computing system 120, to perform imaging of the subject P.

The imaging sequence signifies a pulse sequence corresponding to respective protocols included in an examination performed by the magnetic resonance imaging apparatus 100. In the imaging sequence information, intensity and application timing of power that is supplied by the gradient magnetic field power source 103 to the gradient magnetic field coil 102 intensity and application timing of an RF pulse that is transmitted by the transmitter circuitry 107 to the transmitter coil 106, detection timing of an MR signal by the receiver circuitry 109, and the like are defined.

Having imaged the subject P by driving the gradient magnetic field power source 103, the transmitter circuitry 107, the receiver circuitry 109, the shim coil power source, and the like, the sequence control circuitry 110 receives the MR data from the receiver circuitry 109, and transfers the received MR data to the computing system 120.

The computing system 120 performs overall control of the magnetic resonance imaging apparatus 100, data collection, image generation, and the like. The computing system 120 includes processing circuitry 150, a memory 123, an input device 124, and a display 125. Moreover, the processing circuitry 150 has an interface 121, the image generating function 122, and control function 126.

Respective processing functions performed by the interface 121, the image generating function 122, and the control function 126 are stored in a form of computer-executable program in the memory 123. The processing circuitry 150 is a processor that implements a function corresponding to each program by reading and executing the program from the memory 123. In other words, the processing circuitry 150 that has read each program is to have each function shown in the processing circuitry 150 in FIG. 1. Although FIG. 1 explains that the processing functions performed by the interface 121, the image generating function 122, and the control function 126 are implemented by a single unit of the processing circuitry 150, the processing circuitry 150 can be configured with multiple independent processors combined, to implement a function by executing a program by each processor.

In other words, it can be configured such that the respective functions described above are implemented as programs, and the respective programs are executed by a single unit processing circuitry, or can be configured such that a specific function is implemented by a dedicated independent program-executing circuitry.

A term "processor" used in the above explanation signifies, for example, a circuit such as a central processing unit (CPU), a graphical processing unit (GPU), an application specific integrated circuit (ASIC), a simple programmable logic device (SPLD), a complex programmable logic device (CPLD), and a field programmable gate array (FPGA). The processor reads and executes a program stored in the memory 123, and thereby implements a function. Instead of storing a program in the memory 123, the program can be directly installed in a circuit of the processor. In this case, the processor reads and executes the program installed in the circuit of the processor to implement the function. The bed control circuitry 105, the transmitter circuitry 107, the receiver circuitry 109, the RF pulse generating circuitry 200 (for example, control circuitry 201, acquiring circuitry 202, first generating circuitry 203, a slew rate limiter 203a, interpolating circuitry 203b, filter circuitry 203c, second generating circuitry 204, digital-analog converter circuitry 205, amplifier circuitry 206, delay compensating circuitry 207) and the like are also configured similarly with an electronic circuit such as the above processor.

The processing circuitry 150 transmits imaging sequence information to the sequence control circuitry 110 through the interface 121, and receives the MR data from the sequence control circuitry 110. When receiving the MR data through the interface 121, the processing circuitry 150 stores the received MR data in the memory 123.

The processing circuitry 150 generates an image with the image generating function 122, using the MR data received through the interface 121 or data stored in the memory 123. The processing circuitry 150 transmits an image acquired by the image generating function 122 to the display 125 or the memory 123 as necessary.

The processing circuitry 150 performs overall control of the magnetic resonance imaging apparatus 100 with the control function 126. For example, the processing circuitry 150 generates imaging sequence information based on an imaging condition that is input by an operator through the input device 124, and controls imaging by transmitting the generated imaging sequence information to the sequence control circuitry 110.

The memory 123 stores MR data received by the processing circuitry 150 through the interface 121, image data generated by the image generating function 122, and the like. For example, the memory 123 is, for example, a semiconductor memory device, such as a random-access memory (RAM) and a flash memory, a hard disk, an optical disk, or the like.

The input device 124 accepts various instructions and data input by an operator. The input device 124 is, for example, a pointing device such as a mouse and a trackball, or an input device such as a keyboard.

The display 125 displays various kinds of information, such as image data, under control of the control function 126 in the processing circuitry 150. The display 125 is, for example, a display device such as a liquid crystal display.

The RF pulse generating circuitry 200 is connected to the sequence control circuitry 110, the transmitter circuitry 107, and the like, and generates an RF pulse based on an instruction received from the computing system 120, or information relating to a sequence received from the sequence control circuitry 110. More detailed configuration of the RF pulse generating circuitry 200 is shown in FIG. 2. FIG. 2 is a block diagram showing a configuration of the RF pulse generating circuitry according to the embodiment.

As shown in FIG. 2, the RF pulse generating circuitry 200 includes the control circuitry 201, the acquiring circuitry 202, the first generating circuitry 203, the second generating circuitry 204, the digital-analog converter circuitry 205 the amplifier circuitry 206, and the delay compensating circuitry 207. The first generating circuitry includes the slew rate limiter 203a, the interpolating circuitry 203b, and the filter circuitry 203c.

The acquiring circuitry 202, the first generating circuitry 203, and the second generating circuitry 204 are one example of an acquiring unit, a first generating unit, and a second generating unit, respectively.

The control circuitry 201 is circuitry that acquires, for example, information relating to a pulse sequence to be performed from the sequence control circuitry 110, and that provides envelope data of an RF pulse to be output based on the acquired data to the acquiring circuitry 202. The acquiring circuitry 202 is circuitry that acquires the envelope data of the RF pulse from the control circuitry 201.

The first generating circuitry 203 is circuitry that subjects the envelope data acquired by the acquiring circuitry 202 to predetermined processing by at least one circuitry of the slew rate limiter 203a, the interpolating circuitry 203b, and the filter circuitry 203c, to generate second data that is, for example, the envelope data of the RF pulse with a lowered slew rate. Details of the processing performed by the first generating circuitry 203 are described later.

The second generating circuitry 204 is circuitry that adds a carrier wave of the RF pulse to the envelope data of the RF pulse, to generate data of the RF pulse. The digital-analog converter (DAT) circuitry 205 is circuitry that performs digital-analog conversion processing to convert digital signal into an analog signal.

The amplifier circuitry 206 is, for example, an RF amplifier, and is circuitry that amplifies an input signal and outputs the amplified output signal. The delay compensating circuitry 207 is circuitry to perform delay compensation processing in which time required for processing performed by the first generating circuitry 203 is considered so that the envelope data and the carrier wave are added up at desired timing by the second generating circuitry 204. The processing performed by the delay compensating circuitry 207 is described later.

As above, the overall configuration of the magnetic resonance imaging apparatus 100 according to the embodiment has been explained. Subsequently, a background of the magnetic resonance imaging apparatus 100 according to the embodiment is briefly explained.

In magnetic resonance imaging apparatuses, to generate an RF pulse, for example, a transmission technique such as DDS can be used. In such a case, digital data relating to an envelope of an RF pulse to be output is first generated at predetermined time intervals (for example, 1 µs intervals, or the like) determined by a frequency band of a baseband of the RF pulse, and the RF pulse is then generated based on the generated digital data of the predetermined time intervals.

However, when a pulse with a high baseband frequency, in other words, a pulse a value of which varies significantly in a short period, such as that of UTE, is to be generated by using the DDS, each peak value of the digital data described above increases, and the slew rate (a time rate of change in a signal value) increases. When an RF having a high slew rate is input to an RF amplifier, an output of the RF pulse increases (overshoots) due to a transient phenomenon, and a load on the RF amplifier increases. An RF waveform desired to output cannot be obtained just by making rises of pulse waves mild.

This state is explained using FIG. 3 to FIG. 6. FIG. 3 to FIG. 6 are diagrams for explaining a background of the magnetic resonance imaging apparatus according to the first embodiment.

Figure 3:
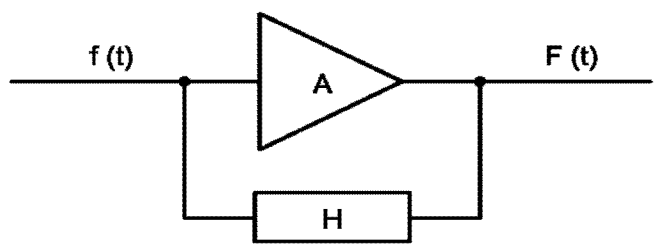
FIGS. 3, 4, 5, and 6 are diagrams for explaining a background of a magnetic resonance imaging apparatus according to a first embodiment.

FIG. 3 shows a model of a typical response of the amplifier circuitry 206. An output signal F(t) is expressed as F(t)=(1/(H+1/A))×f(t), where time is t, an input signal is f(t), an amplification factor of an amplifier is A, and an attenuation factor of feedback circuitry is H as shown in FIG. 3. When an input signal is time dependent, the output signal F(t) can show a transient response when the slew rate of the input signal f(t) is high.

Figure 4:
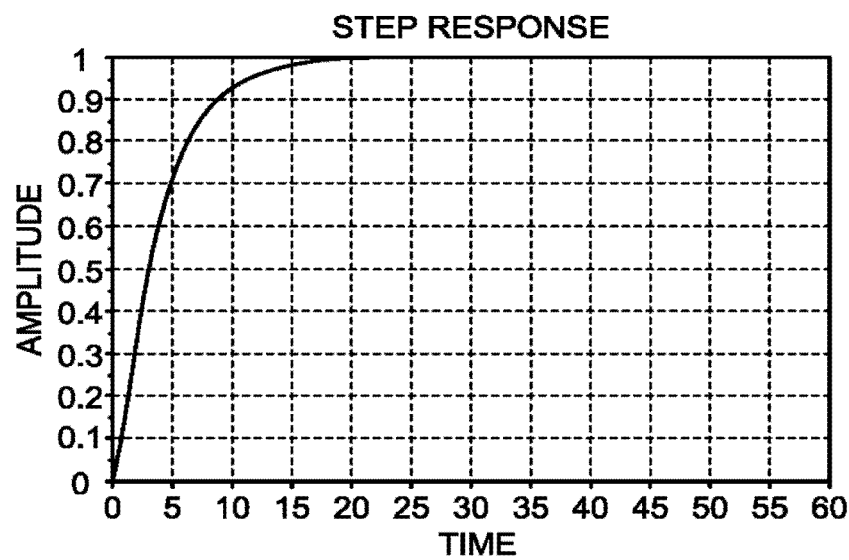

FIG. 4 shows one example of a change of an output signal with time when the slew rate of the input signal is "small". A horizontal axis is for time, and a vertical axis is for an amplitude of the output signal. In this case, as the slew rate of the input signal is "small", the output signal is stabilized in short time by feedback.

Figure 5:
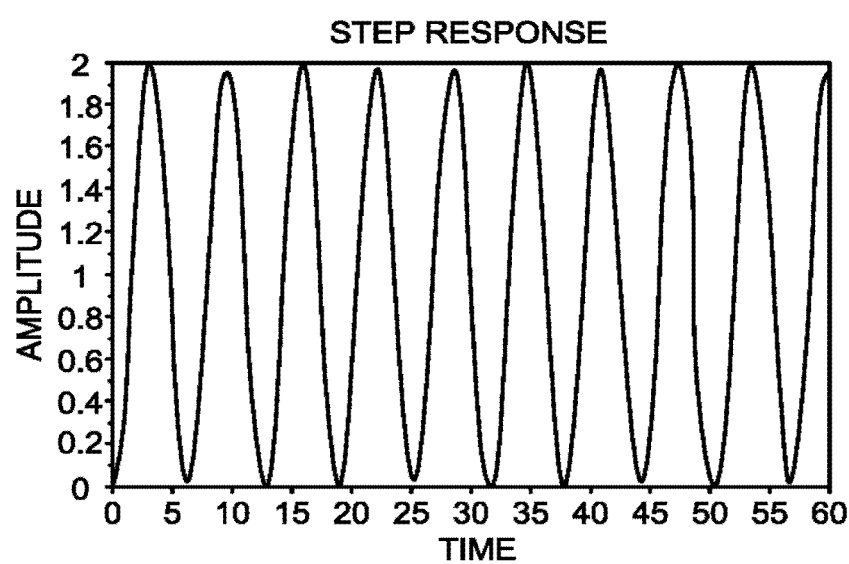

On the other hand, FIG. 5 shows one example of a change of an output signal with time when the slew rate of the input signal is "large". A horizontal axis is for time, and a vertical axis is for an amplitude of the output signal. In this case, the output signal is not stabilized due to the amplification factor of the amplifier and an impedance of the feedback circuitry, and a transient phenomenon occurs.

When the transient phenomenon thus occurs, the amplifier circuitry 206 can be likely to be damaged, or a system failure can occur as a protection circuit is actuated. Therefore, the slew rate of an input signal to the amplifier circuitry 206 is desirable to take a value suitable for the amplifier circuitry 206.

Figure 6:
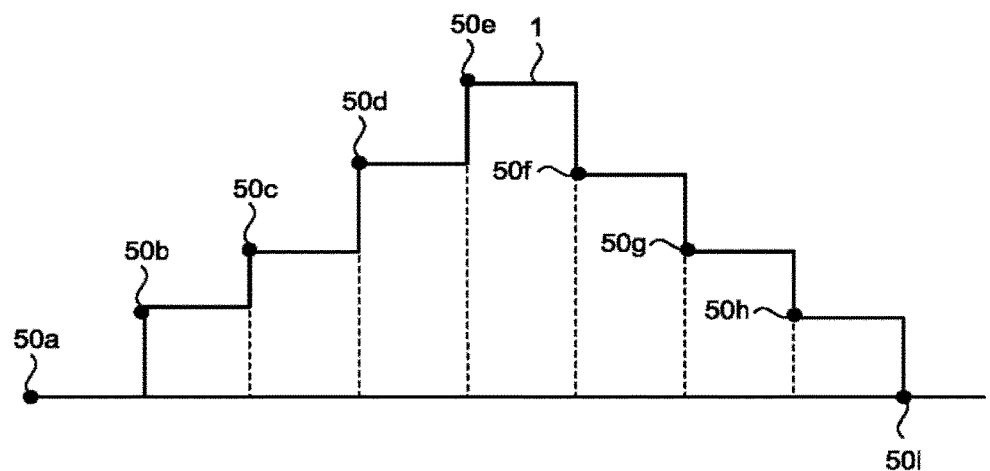

FIG. 6 shows a typical example of a relationship between signal data generated by the DDS and data output to the RF amplifier. A horizontal axis is for time, and a vertical axis is for a signal intensity. Data signals 50a, 50b, 50c, 50d, 50e, 50f, 50g, 50h, and 50i are envelope data of an RF pulse generated by the DDS. A waveform 1 expressed by a solid line is generated based on the envelope data of the RF pulse, and shows a typical example of a waveform output to subsequent circuitry.

The envelope data generated by the DDS is generated, for example, at predetermined time intervals (for example, 1 µs) as shown in FIG. 6. Due to hardware limits, there is an upper limit for a transfer speed of the envelope data, and therefore, a time interval of the envelope data is not to be shorter than the predetermined time interval. In this case, the waveform generated based on the envelope is, for example, in a rectangular shape as the waveform 1, and is a waveform having a large slew rate. When such a waveform is input to the RF amplifier, a load on the RF amplifier is heavy. Therefore, a waveform to be input to the RF amplifier is desirable to be a waveform that allows the RF amplifier to respond, that is, a waveform having a small slew rate.

Figure 7:
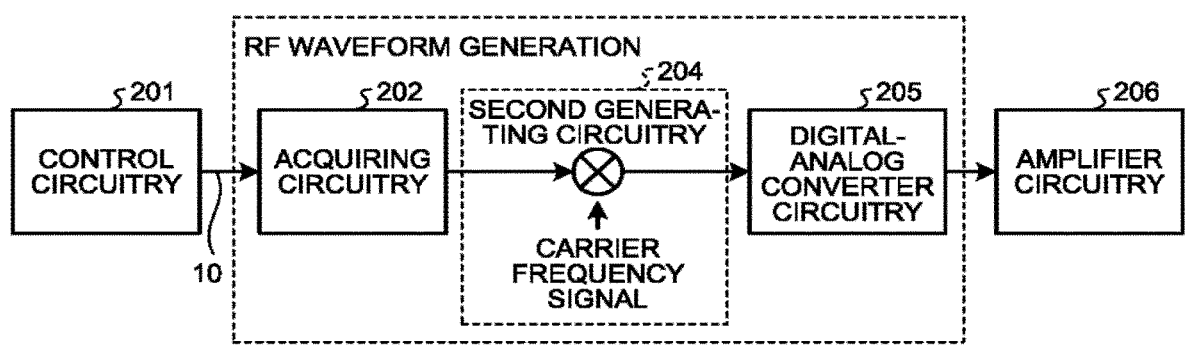
FIG. 7 is a diagram for explaining a configuration of a magnetic resonance imaging apparatus to which a slew rate limiter is not applied.

Next, a flow of processing performed by the RF pulse generating circuitry 200 when a slew rate limiter is not used is explained using FIG. 7. FIG. 7 is a diagram for explaining a configuration of the magnetic resonance imaging apparatus 100 to which a slew rate limiter is not applied.

In FIG. 7, the control circuitry 201, the acquiring circuitry 202, the second generating circuitry 204, the digital-analog converter circuitry 205, and the amplifier circuitry 206 correspond to the control circuitry 201, the acquiring circuitry 202, the second generating circuitry 204, the digital-analog converter circuitry 205, and the amplifier circuitry 206 in FIG. 2, respectively. An arrow 10 shows a flow of the envelope data of the RF waveform.

First, the control circuitry 201 acquires information relating to a pulse sequence to be performed from the sequence control circuitry 110. On the other hand, the control circuitry 201 acquires information, for example, an instruction from a user and the like, from the computing system 120. One example of the information that is acquired by the control circuitry 201 is, for example, information indicating a type of envelope of an RF pulse to be output (for example, envelope in what shape), and information indicating parameters (for example, peak, application timing, application duration, and the like) relating to an envelope of an RF pulse to be output, parameters (for example, Larmor frequency, intensity of a carrier wave) relating to a carrier wave of an RF pulse to be output, parameters relating to electrical characteristics of an RF amplifier, an upper limit value of a slew rate, or the like. Subsequently, the control circuitry 201 outputs the information relating to the envelope of the RF pulse to the acquiring circuitry 202 as indicated by the arrow 10. As described above, due to hardware limits, there is an upper limit for a transfer speed of the envelope data, and therefore, a time interval of the envelope data is not to be shorter than, for example, a predetermined time interval.

The acquiring circuitry 202 acquires the information relating to the envelope of the RF pulse from the control circuitry 201. The acquiring circuitry 202 generates an envelope signal of the RF pulse based on the acquired information relating to the envelope of the RF pulse, and outputs the generated envelope signal of the RF pulse to the second generating circuitry 204. For example, the acquiring circuitry 202 acquires the data signals 50a, 50b, 50c, 50d, 50e, 50f, 50g, 50h, and 50i in FIG. 6 as the information relating to the envelope of the RF pulse, and outputs the waveform 1 to the second generating circuitry 204.

Subsequently, the second generating circuitry 204 generates a signal of the RF pulse by superimposing the input envelope signal on a carrier frequency signal, and outputs the generated signal to the digital-analog converter circuitry 205. The digital-analog converter circuitry 205 converts the input signal, which is a digital signal, into an analog signal to output to the amplifier circuitry 206. The amplifier circuitry 206 amplifies the input analog signal, and outputs the obtained signal to the transmitter circuitry 107.

With the configuration not using a slew rate limiter, a load on an RF amplifier can be heavy as described above. In this context, the RF pulse generating circuitry 200 according to the embodiment generates envelope data in which the maximum value of a slew rate is lowered based on envelope data of an RF pulse and an upper limit value of a slew rate to be satisfied for a pulse. Thus, it is possible to suppress a slew rate while keeping peaks of data high. As a result, a load on an RF amplifier can be reduced.

Figure 8:
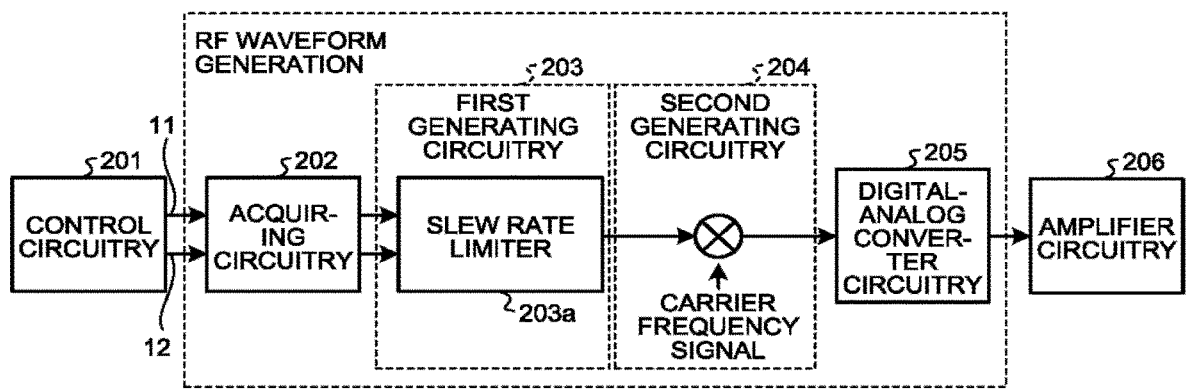
FIG. 8 is a diagram for explaining a configuration of the magnetic resonance imaging apparatus according to the first embodiment.
Figure 9:
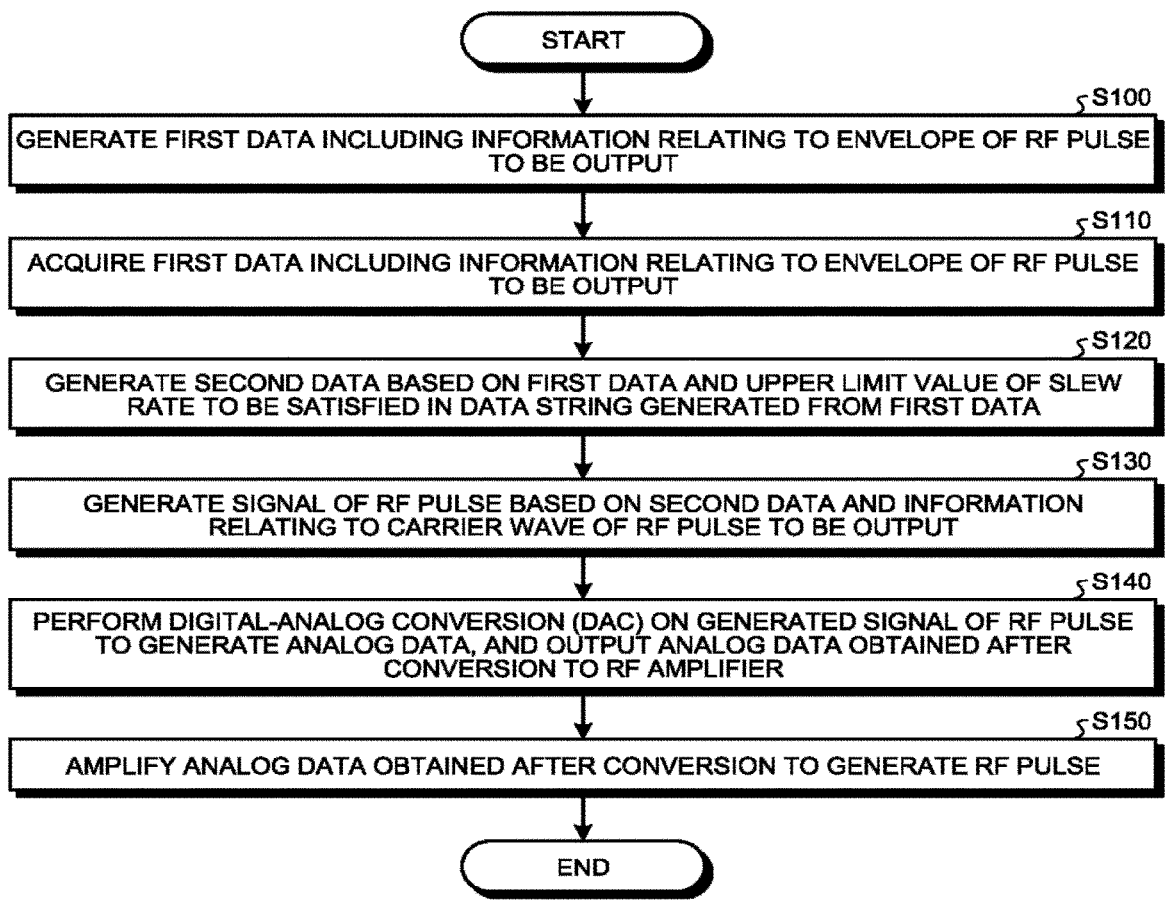
FIG. 9 is a flowchart explaining a flow of processing that is performed by the magnetic resonance imaging apparatus according to the first embodiment.
Figure 10:
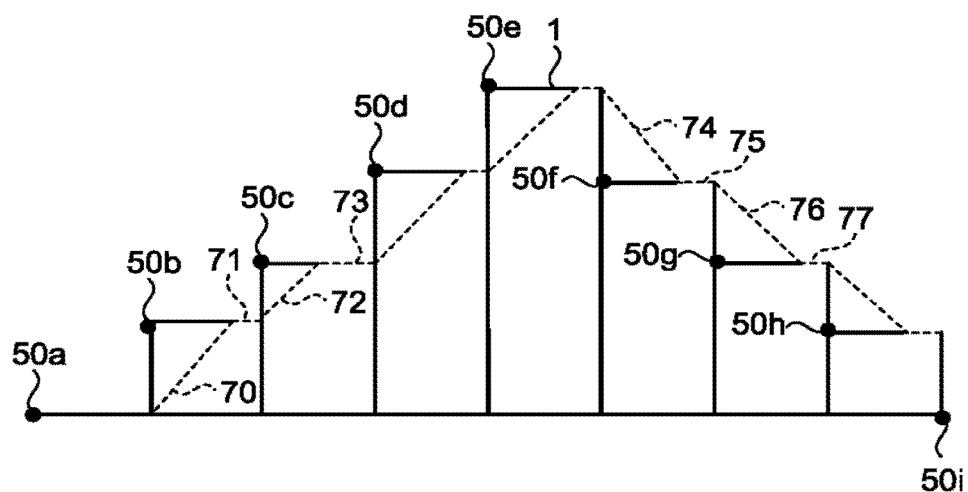
FIG. 10 is a diagram for explaining the processing performed by the magnetic resonance imaging apparatus according to the first embodiment.
Figure 11:
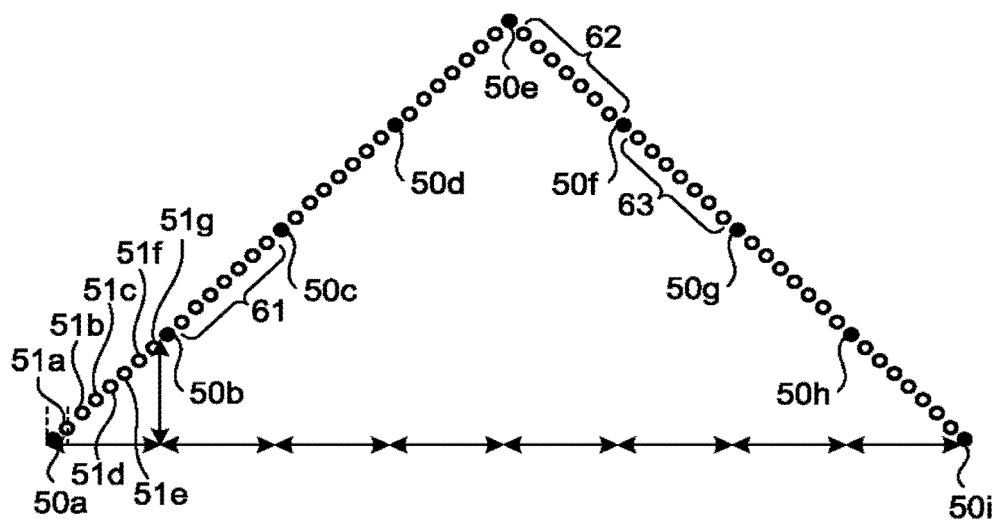
FIG. 11 is a diagram for explaining the processing performed by the magnetic resonance imaging apparatus according to the first embodiment.

Such a configuration is explained using FIG. 9 while referring to FIG. 8, FIG. 10, and FIG. 11 when necessary. FIG. 8 is a diagram for explaining a configuration of the magnetic resonance imaging apparatus 100 according to the first embodiment. FIG. 9 is a flowchart explaining a flow of processing that is performed by the magnetic resonance imaging apparatus 100 according to the first embodiment. FIG. 10 and FIG. 11 are diagrams for explaining the processing performed by the magnetic resonance imaging apparatus 100 according to the first embodiment.

In FIG. 8, the control circuitry 201, the acquiring circuitry 202, the first generating circuitry 203, the slew rate limiter 203a, the second generating circuitry 204, the digital-analog converter circuitry 205, the amplifier circuitry 206 correspond to the control circuitry 201, the acquiring circuitry 202, the first generating circuitry 203, the slew rate limiter 203a, the second generating circuitry 204, the digital-analog converter circuitry 205, and the amplifier circuitry 206 in FIG. 2, respectively. An arrow 11 shows a flow RF waveform envelope data. An arrow 12 shows a flow of information of a slew-rate upper limit value.

First, the control circuitry 201 acquires information relating to a pulse sequence to be performed from the sequence control circuitry 110. Moreover, the control circuitry 201 acquires information such as an instruction from a user from the computing system 120. One example of the information that is acquired by the control circuitry 201 is, as has already been described, for example, information indicating a type of envelope of an RF pulse to be output (for example, envelope in what shape), and information indicating parameters (for example, peak, application timing, application duration, and the like) relating to an envelope of an RF pulse to be output, parameters (for example, Larmor frequency, intensity of a carrier wave) relating to a carrier wave of an RF pulse to be output, parameters relating to electrical characteristics of an RF amplifier, an upper limit value of a slew rate that is to be satisfied in a data string generated from the first data described later, or the like. The control circuitry 201 generates first data (hereinafter, also referred to as "first data string" as necessary) that includes the information relating to the envelope of the RF pulse to be output based on the acquired information (step S100). The control circuitry 201 outputs the first data including the information relating to the envelope of the RF pulse to be output to the acquiring circuitry 202 as indicated by the arrow 11. Furthermore, the control circuitry 201 outputs an upper limit value of a slew rate to the acquiring circuitry 202 as indicated by the arrow 12.

Subsequently, the acquiring circuitry 202 acquires the first data including the information relating to the envelope of the RF pulse to be output (step S110). For example, the acquiring circuitry 202 acquires the data signals 50*a*, 50*b*, 50*c*, 50*d*, 50*e*, 50*f*, 50*g*, 50*h*, and 50*i* shown in FIG. 6 from the control circuitry 201 as the information relating to the envelope of the RF pulse to be output. Subsequently, the first generating circuitry 203 generates second data (hereinafter, also referred to as "second data string" as necessary) based on the first data acquired by the acquiring circuitry 202 at step S110 and the upper limit value of the slew rate to be satisfied by a data string generated from the first data (step S120). For example, the first generating circuitry 203 interpolates the first data string of digital data including the envelope information of the RF pulse to be output to generate the second data string, a variation amount of digital data adjacent to each other in the first data string of which is lower than the upper limit value.

Specifically, when the processing at step S120 is not performed, a waveform of the second data to be generated to have a shape as that of a step function, as the waveform 1 shown in FIG. 10 described later, and the slew rate increases. Accordingly, by performing the processing at step S120, the first generating circuitry 203 can suppress the slew rate of a waveform of the second data to be generated. In the first generating circuitry 203, constraints in hardware and the like are moderate compared to the DDS. Therefore, it is possible to perform data processing for a time interval shorter than a time interval (for example, a time interval between the data signal 50*a* and the data signal 50*b*) of the information relating to the envelope acquired by the acquiring circuitry 202.

First, as a first example of the processing at step S120, a case in which the first generating circuitry 203 generates the second data using the slew rate limiter 203*a* as shown in FIG. 8 is explained. That is, the first generating circuitry 203 generates the second data that is the data in which the slew rate does not exceed the acquired upper limit value of the slew rate by performing the processing using the slew rate limiter 203*a* on the first data.

As for an exemplary configuration the slew rate limiter 203*a*, the slew rate limiter 203*a* is constituted of a detecting circuitry that detects a magnitude of a slew rate of an input signal, and feedback circuitry that applies negative feedback (or removes a detected signal) to the input signal when a high slew rate is detected. The detecting circuitry and the feedback circuitry are digital circuits that correspond to a coil in an analog circuit and a differential amplifier, respectively. The slew rate limiter 203*a* can cut a signal exceeding, for example, a predetermined upper limit value of a slew rate entirely, or can control the size of the signal exceeding the predetermined upper limit value of a slew rate. As a result, the slew rate limiter 203*a* outputs the second data that is data, the slew rate of which is lower than the first data.

Next, as a second example of the processing at step S120, a case in which the first generating circuitry 203 generates the second data using the interpolating circuitry 203*b* is explained using FIG. 10 and FIG. 11.

In FIG. 10, a horizontal axis is for time, and a vertical axis is for a signal intensity. Similarly to FIG. 6, the data signals 50*a*, 50*b*, 50*c*, 50*d*, 50*e*, 50*f*, 50*g*, 50*h*, and 50*i* respectively expresses data points in the first data that includes the information relating to the envelope of the RF pulse to be output. The waveform 1 expresses data to be output when it is assumed that the interpolation processing is not performed. A dotted line expresses the second data that is generated by performing the processing including the interpolation processing on the first data by the first generating circuitry 203. A line segment 70, a line segment 71, a line segment 72, a line segment 73, a line segment 74, a line segment 75, a line segment 76, and a line segment 77 are portions extracted from the dotted line. The second data is generated, for example, based on the interpolation processing shown in FIG. 11.

In FIG. 11, a horizontal axis is for time and a vertical axis is for a signal intensity. Similarly to FIG. 6, black circles of the data signals 50*a*, 50*b*, 50*c*, 50*d*, 50*e*, 50*f*, 50*g*, 50*h*, 50*i*, and the like respectively express data points in the first data that includes the information relating to the envelope of the RF pulse to be output. White circles of a point 51*a*, a point 51*b*, a point 51*c*, a point 51*d*, a point 51*e*, a point 51*f*, a point 51*g*, and the like express points at which the interpolation processing has been performed. A section 61, a section 62, and a section 63 express time sections from the data signals 50*b*, 50*e*, and 50*f* to the data signals 50*c*, 50*f*, and 50*g*, respectively.

At step S120, acquiring the data signal through the acquiring circuitry 202, the first generating circuitry 203 performs be interpolation processing between a data point just acquired and a data point previously acquired. For example, acquiring the data signal 50*a* and the data signal 50*b*, the first generating circuitry 203 performs the linear interpolation between the data signal 50*a* and the data signal 50*b*, to generate points such as the point 51*a*, the point 51*b*, the point 51*c*, the point 51*d*, the point 51*e*, the point 51*f*, and the point 51*g*.

Subsequently, the first generating circuitry 203 generates the second data that is data in which the slew rate is suppressed based on a result of the interpolation processing performed. For example, at the time of the data signal 50*b* to the time of the data signal 50*c*, the first generating circuitry 203 generates data, for example, as the line segment 70, the signal value of which increases at a mild pace to reach the value of the data signal 50*b*, which is the target value, based on a result of the interpolation processing as the second data. The first generating circuitry 203 regards a slope of the line segment 70 as, for example, a slope of a straight line connecting the point 51g and the data signal 50b. For another example, the first generating circuitry 203 regards the slope of the line segment 70 as, for example, a slope of a straight line connecting the data signal 50a and the data signal 50b. When the signal value reaches the value of the data signal 50b, which is the target value, the first generating circuitry 203 generates data as the line segment 71 in which the signal value is fixed to the value of the data signal 50b, as the second data.

Similarly, at the time of the data signal 50c to the time of the data signal 50d, the first generating circuitry 203 generates data, for example, as the line segment 72, the signal value of which increases at a mild pace to reach the value of the data signal 50c, which is the target value, based on a result of the interpolation processing in the section 61 as the second data. When the signal value reaches the value of the data signal 50c, which is the target value, the first generating circuitry 203 generates data as the line segment 73 in which the signal value is fixed to the value of the data signal 50c, as the second data.

Similarly, at the time of the data signal 50f to the time of the data signal 50g, the first generating circuitry 203 generates data, for example, as the line segment 74, the signal value of which decreases at a mild pace to reach the value of the data signal 50f, which is the target value, based on a result of the interpolation processing in the section 62 as the second data. When the signal value reaches the value of the data signal 50f, which is the target value, the first generating circuitry 203 generates data as the line segment 75 in which the signal value is fixed to the value of the data signal 50f, as the second data.

Similarly, at the time of the data signal 50g to the time of the data signal 50h, the first generating circuitry 203 generates data, for example, as the line segment 76, the signal value of which decreases at a mild pace to reach the value of the data signal 50g, which is the target value, based on a result of the interpolation processing in the section 63 as the second data. When the signal value reaches the value of the data signal 50g, which is the target value, the first generating circuitry 203 generates data as the line segment 77 in which the signal value is fixed to the value of the data signal 50g, as the second data.

As described, the first generating circuitry 203 generates the second data by subjecting the first data to the processing including the interpolation processing.

The interpolation processing is not limited to the linear interpolation, but another kind of interpolation, such as logarithmic interpolation, exponential interpolation, spline interpolation, and Lagrange interpolation, can be applied. Moreover, the first generating circuitry 203 can generate the second data by performing processing including interpolation processing according to a type of the first data. The type of the first data is, for example, a type of a pulse sequence, a size of a time interval of the first data to be generated, or the like. For example, the first generating circuitry 203 applies the logarithmic interpolation for such a waveform that the signal value varies significantly, and applies the linear interpolation for a normal waveform. Moreover, for another example, the first generating circuitry 203 applies the spline interpolation when high precision is demanded for a waveform, and applies the linear interpolation for a normal case.

Next, as a third example of the processing at step S120, a case in which the first generating circuitry 203 generates the second data by using the filter circuitry 203c is explained. That is, the first generating circuitry 203 generates the second data by performing processing including the filter processing on the first data.

A specific example of the filter circuitry 203c is, for example, a smoothing filter and filter circuitry that performs moving average filter. Furthermore, as another example the filter circuitry 203c, it can be filter circuitry having a function of a lowpass filter.

Moreover, the first generating circuitry 203 generates the second data by performing processing that includes filter processing according to a type of the first data. As described above, specific example of the type of the first data is, for example, a type of a pulse sequence, a size or a time interval of the first data, and the like. As one example of the processing, for example, the first generating circuitry 203 changes a cutoff frequency of a lowpass filter according to the type of the first data.

When the processing at step S120 is thus completed, the first generating circuitry 203 outputs the generated second data to the second generating circuitry 204. Subsequently, the second generating circuitry 204 generates a signal of the RF pulse based on the second data generated by the first generating circuitry 203, and the information relating to the carrier wave of the RF pulse to be output (step S130).

Subsequently, the digital-analog converter circuitry 205 subjects the generated signal of the RF pulse to digital-analog conversion (DAC) to generate analog data, and outputs the analog data obtained by the digital-analog conversion to the RF amplifier (amplifier circuitry 206) (step S140). The RF amplifier (amplifier circuitry 206) amplifies the analog data obtained by conversion, to generate an RF pulse (step S150). In other words, the signal of the RF pulse with the digital data that has been generated by the second generating circuitry 204 in digital data is subjected to the digital-analog conversion, and the obtained analog data is output to the RF amplifier (amplifier circuitry 206). When generating an RF pulse in digital data in which data of an envelope and data of a carrier wave are combined, there is an advantage that a stable waveform is likely to be obtained compared to a case of generating an RF pulse by generating only envelope data in digital data, and by combining the envelope data subjected to digital-analog conversion with a carrier wave in analog data.

As described above, according to the magnetic resonance imaging apparatus 100 of the first embodiment, it is possible to generate an RF pulse while reducing a load on an RF amplifier. More specifically, for example, generation of unnecessary pulses that is caused by overshooting or the like occurring as a result of inputting a signal having a high slew rate into the amplifier circuitry 206 (RF amplifier). Moreover, even when a pulse with a short pulse width is output, a stable waveform of an RF pulse can be output without reducing a rising speed of the pulse. Unlike a case of generating, for example, a gradient magnetic field waveform, in generation of an RF pulse, in addition to processing using a slew rate limiter, processing of superimposing envelope data to a carrier wave is performed after the processing using a slew rate limiter.

A significance of the acquiring circuitry 202 acquiring the first data, which is envelope data generated by the DDS, for example, at regular intervals (for example, 1 μs) at step S110, and of the first generating circuitry 203 generating the second data by interpolation or the like based on the first data and an upper limit value of a slew rate at step S120 is additionally explained. For example, if the acquisition interval for the first data, which is the envelope data generated by the DDS, is sufficiently shortened, it seems that it is not necessary for the processing such as interpolation to be performed by the first generating circuitry 203 at step S120. However, there is an upper limit for the transfer speed of envelope data considering hardware limits, and it cannot be practical to increase the transfer speed of envelope data to a high speed due to hardware issues such as cost and heat. Even in such a case, the magnetic resonance imaging apparatus according to the embodiment can stabilize an output waveform of a final RF pulse.

Embodiments are not limited thereto. As one example, the maximum value of a slew rate that is allowed to be output to an RF amplifier varies per RF amplifier (for example, manufacturer or a model of an RF amplifier). Therefore, at step S120, the first generating circuitry 203 can generate the second data based on an upper limit value of a slew rate according to electrical characteristics of the RF amplifier to which data is output at step S140. By applying this configuration, an input of an RF amplifier can be optimized according to characteristics of the RF amplifier.

Furthermore, since predetermined processing time is necessary for the processing at step S120, a waveform of the second data is to have predetermined delay time when relative to the first data. Therefore, the processing at step S130 can be performed considering the delay time. Specifically, the second generating circuitry 204 can include processing of compensating the delay time that is the time necessary for the first generating circuitry 203 to generate the second data in the processing at step S130, to generate a signal of an RF pulse. In other words, the second generating circuitry 204 inputs the data of the carrier wave giving a delay from the envelope data, for example, by time corresponding to the delay time. Alternatively, the first generating circuitry 203 can input the envelope data at earlier timing, for example, by time corresponding to the delay time from the data of the carrier wave to the slew rate limiter 203a. The delay time described above can be given in advance before starting generation of an RF pulse, or a value of the delay time can be calculated by the RF pulse generating circuitry 200 prior the processing at step S130.

The processing considering the delay time is applicable to a modification described below.

First Modification of First Embodiment

In the first embodiment, a case in which a signal of an RF pulse that has been generated by the second generating circuitry 204 in a digital form based on the second data and the information of a carrier wave is digital-analog converted by the digital-analog converter circuitry 205 to generate analog data has been explained. Embodiments are not limited thereto. In a first modification of the first embodiment, the digital-analog converter circuitry 205 subjects the second data, which is digital data, to digital-analog conversion to generate analog data, and the second generating circuitry 204 then combines it with envelope data and data of a carrier wave in an analog form, to generate a signal of an RF pulse.

Figure 12:
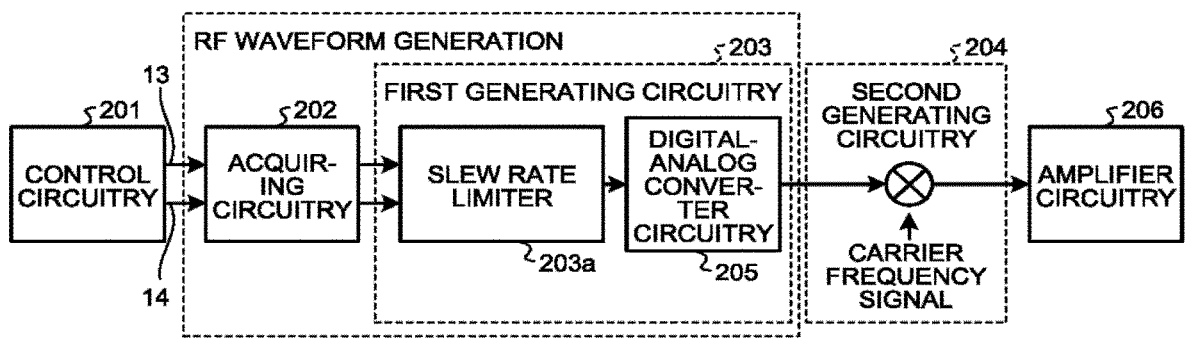
FIG. 12 is a diagram for explaining a configuration of a magnetic resonance imaging apparatus according to a first modification of the first embodiment.
Figure 13:
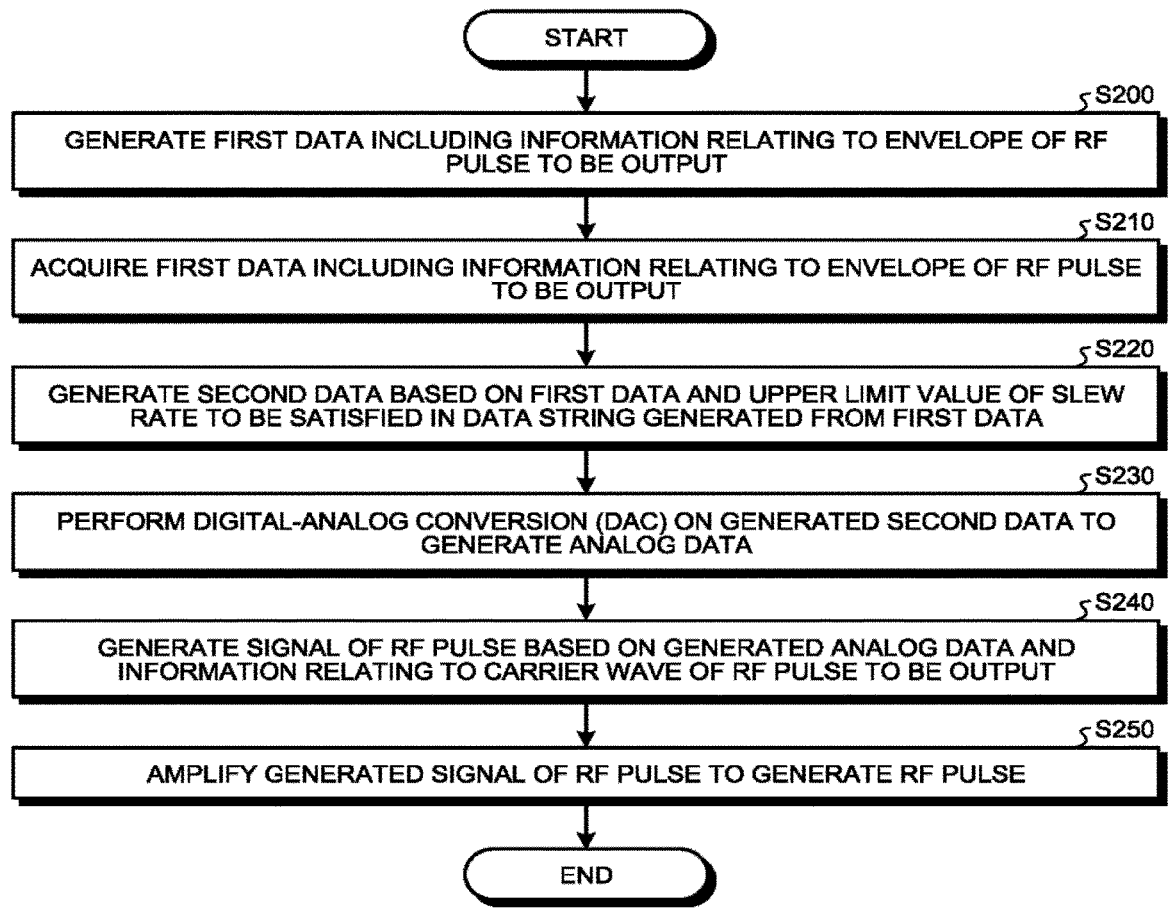
FIG. 13 is a flowchart explaining a flow of processing performed by the magnetic resonance imaging apparatus according to the first modification of the first embodiment.

FIG. 12 is a diagram for explaining a magnetic resonance imaging apparatus according to the first modification of the first embodiment. FIG. 13 is a flowchart explaining a flow of processing performed by the magnetic resonance imaging apparatus according to the first modification of the first embodiment.

In FIG. 12, the control circuitry 201, the acquiring circuitry 202, the first generating circuitry 203, the slew rate limiter 203a, the second generating circuitry 204, and the amplifier circuitry 206 correspond to the control circuitry 201, the acquiring circuitry 202, the first generating circuitry 203, the slew rate limiter 203a, the second generating circuitry 204, and the amplifier circuitry 206 in FIG. 2, respectively. The digital-analog converter circuitry 205 in FIG. 12 is circuitry that performs processing similar to that of the digital-analog converter circuitry 205 in FIG. 2. An arrow 13 expresses envelope data of an RF waveform. An arrow 14 expresses information of an upper limit value of a slew rate.

In FIG. 13, step S200, step S210, step S220, and step S250 correspond to step S100, step S110, step S120, and step S150 in FIG. 9. As the processing has already been explained in the first embodiment, repeated explanation is omitted.

At step S220, when the slew rate limiter 203a generates the second data, the first generating circuitry 203 outputs the generated second data to the digital-analog converter circuitry 205. Subsequently, the digital-analog converter circuitry 205 subjects the generated second data to digital-analog conversion (DAC), to generate analog data (step S230). The digital-analog converter circuitry 205 outputs the generated analog data to the second generating circuitry 204. Subsequently, the second generating circuitry 204 generates a signal of an RF pulse based on the generated analog data and information relating to a carrier wave of the RF pulse to be output (step S240). The second generating circuitry 204 inputs the generated signal of the RF pulse to the amplifier circuitry 206.

As described, in the first modification of the first embodiment, an RF pulse can be generated while reducing a load on an RF amplifier, similarly to the first embodiment.

Second Modification of First Embodiment

In the first embodiment, a case in which the first generating circuitry 203 generates the second data using the slew rate limiter 203a at step S120 has been explained. Embodiments are not limited thereto. In a second modification of the first embodiment, a case in which the first generating circuitry 203 generates the second data using two or more circuits out of the slew rate limiter 203a, the interpolating circuitry 203b, and the filter circuitry 203c at a step corresponding to step S120 is explained. The slew rate limiter 203a, the interpolating circuitry 203b, and the filter circuitry 203c have advantages and disadvantages in terms of signal stability. Therefore, by combining these circuitry appropriately, it becomes possible to further stabilize a final output.

Figure 14:
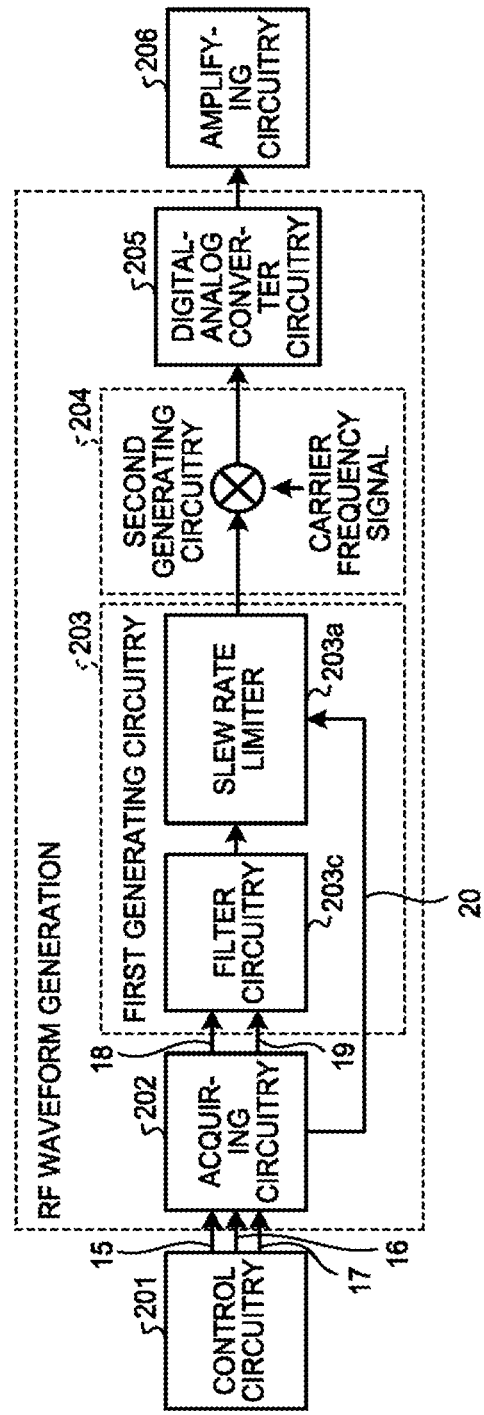
FIG. 14 is a diagram for explaining a configuration of a magnetic resonance imaging apparatus according to a second embodiment of the first embodiment.
Figure 15:
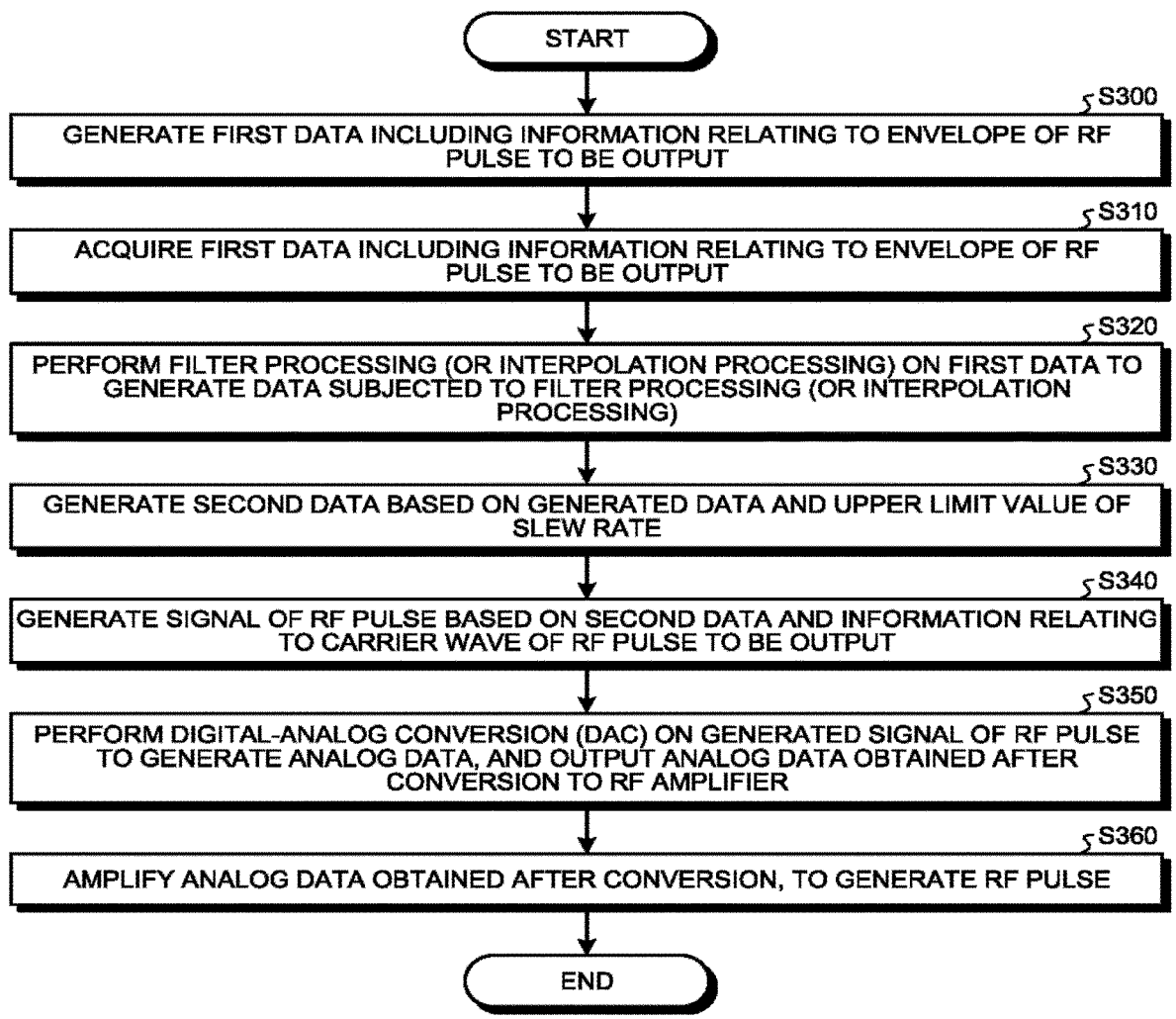
FIG. 15 is a flowchart explaining a flow of processing performed by the magnetic resonance imaging apparatus according to the second modification of the first embodiment.

FIG. 14 is a diagram for explaining a configuration of a magnetic resonance imaging apparatus according to the second modification of the first embodiment. FIG. 15 is a flowchart explaining a flow of processing performed by the magnetic resonance imaging apparatus according to the second modification of the first embodiment.

In FIG. 14, the control circuitry 201, the acquiring circuitry 202, the first generating circuitry 203, the filter circuitry 203c, the slew rate limiter 203a, the digital-analog converter circuitry 205, the second generating circuitry 204, and the amplifier circuitry 206 correspond to the control circuitry 201, the acquiring circuitry 202, the first generating circuitry 203, the filter circuitry 203c, the slew rate limiter 203a, the digital-analog converter circuitry 205, the second generating circuitry 204, and the amplifier circuitry 206 in FIG. 2, respectively. An arrow 15 and an arrow 10 express envelope data of an RF waveform. An arrow 16 and an arrow 19 express predetermined parameters that are used in processing performed by the filter circuitry 203c, such as a sampling pitch and a type of waveform of an RF pulse. An arrow 17 and an arrow 20 expressed information of an upper limit value of a slew rate.

In FIG. 15, step S300, step S310, step S340, step S350, and step S360 correspond to step S100, step S110, step S130, step S140, and step S150 in FIG. 9, respectively. As the processing has been explained in the first embodiment, repeated explanation is omitted.

At step S310, when the acquiring circuitry 202 acquires the first data that includes information relating to an envelope of an RF pulse to be output, subsequently, the first generating circuitry 203 performs, for example, filter processing on the first data to generate data subjected to the filter processing (step S320). At this time, the first generating circuitry 203 selects a type of filter processing to be applied at step S320 based on a sampling pitch or a type of a waveform of the RF pulse acquired from the acquiring circuitry 202, and generates data subjected to the filter processing based on the selected filter processing.

Moreover, for another example, at step S320, the first generating circuitry 203 can generate data subjected to interpolation by performing interpolation processing on the first data by the interpolating circuitry 203b.

Subsequently, the first generating circuitry 203 generates the second data based on data generated by the slew rate limiter 203a and an upper limit value of a slew rate (step S330). In other words, the first generating circuitry 203 generates the second data based on the data acquired by performing the filter processing (or the interpolation processing) on the first data, and the upper limit value of a slew rate. The first generating circuitry 203 outputs the generated second data to the second generating circuitry 204.

Embodiments are not limited to these. For example, processing order of the interpolating circuitry 203b, the filter circuitry 203c, and the slew rate limiter 203a is not limited to the above example, and after the processing by the slew rate limiter 203a, processing can be performed by the interpolating circuitry 203b or the filter circuitry 203c. Furthermore, the processing can be performed by the three pieces of circuitry of the interpolating circuitry 203b, the filter circuitry 203c, and the slew rate limiter 203a, or processing can be performed by the interpolating circuitry 203b and the filter circuitry 203c without performing processing by the slew rate limiter 203a.

Other Embodiment

Embodiments are not limited to these. Although an example in which the first generating circuitry 203 generates the second data from the first data by applying a digital process, and the digital-analog converter circuitry 205 converts it into analog data has been explained, embodiments are not limited thereto, and processing of generating the second data can be performed by applying an analog process. In other words, the first generating circuitry 203 can generate the second data based on the first data and a value of an upper limit value of a slew rate by using analog circuitry.

The analog circuitry can be constituted of, for example, circuitry using a variable gate amplifier (VGA). In the VGA, as an amplification factor of a signal is dependent on a voltage to be applied, the gain can be variably controlled by controlling the voltage dynamically. When the VGA is used at step S120, the first data is not required to be digital data generated by the DDS.

Moreover, for another example, the RF pulse generating circuit 200 can perform predetermined correction processing on the first data to compensate overshooting subsequent to step S110 and prior to the processing at step S120, and handle the data that has been subjected to the correction processing as the first data at step S120.

Program

Instructions in the processing procedure described in the above embodiment can be executed based on a software program. By storing this program in a general-purpose computing system in advance, and by reading this program, similar effects as those of the magnetic resonance imaging apparatus 100 of the above embodiment can be obtained. The instructions described in the above embodiment are recorded as a computer-executable program in a magnetic disk (flexible disk, hard disk, and the like), an optical disk (compact disk read-only memory (CD-ROM), compact disk recordable (CD-R), compact disk rewritable (CD-RW), digital versatile disk (DVD)-ROM, DVD±R, DVD±RW, and the like), a semiconductor memory, or a recording medium similar to those. As long as it is a storage medium that can be read by a computer or an integrated system, the storage format can be of any format. The computer reads the program from this recording medium, and causes a CPU to execute instructions described in the program based on this program, thereby implementing operations similar to those of the magnetic resonance imaging apparatus 100. When acquiring or reading the program, the computer can acquire or read the program through a network.

Moreover, a part of the respective processing to implement the embodiment described above can be performed by an operating system (OS) operating on a computer, database management software, middleware (MW) of a network, or the like based on the instructions of the program that is installed in the computer or the integrated system from the storage medium.

Furthermore, the storage medium is not limited to an independent medium from the computer or the integrated system, but includes a storage medium that downloads the program transmitted through a local area network (LAN), the Internet, or the like to store or temporarily store therein.

Moreover, the storage medium is not limited to be one. A case in which the processing in the above embodiment is performed from multiple mediums is also included in the storage medium in the embodiment, and the medium can take either configuration.

The computer or the integrated system in the embodiment is to perform the respective processing in the embodiment described above based on the program stored in the storage medium, and can be structured with a device constituted of one of a personal computer, a microcomputer, and the like, or with a system in which multiple devices are connected through a network, or the like.

Furthermore, the computer in the embodiment is not limited to a personal computer, but includes an arithmetic processing unit, a microcomputer, and the like included in an information processing apparatus. It is a general term for devices and apparatuses that can implement the functions in the embodiment by the program.

According to the magnetic resonance imaging apparatus 100 of at least one of the embodiments described above, an RF pulse can be generated while reducing a load on an RF amplifier.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    first generating circuitry configured to interpolate a first data string that is a digital data string being envelope information of a radio frequency (RF) pulse to be output, thereby generating a second data string in which a variation amount of digital data adjacent to each other in the first data string is smaller than an upper limit value; and
    second generating circuitry configured to generate a signal of the RF pulse by combining the second data string generated by the first generating circuitry and information relating to a carrier wave of the RF pulse, and configured to output the signal to an RF amplifier,
    wherein the first generating circuitry is configured to generate the second data string based on a maximum value of a slew rate that varies depending on a manufacturer or a model of the RF amplifier.

2. The magnetic resonance imaging apparatus according to claim 1, further comprising
    acquiring circuitry configured to acquire the upper limit value, wherein
    the first generating circuitry is configured to generate the second data string based on the upper limit value acquired by the acquiring circuitry.

3. The magnetic resonance imaging apparatus according to claim 2, wherein
    the first generating circuitry is configured to generate the second data string based on the first data string and a value of the upper limit value by using analog circuitry.

4. The magnetic resonance imaging apparatus according to claim 1, wherein
    the second generating circuitry is configured to perform processing of compensating a delay time that corresponds to time for generating the second data string by the first generating circuitry.

5. The magnetic resonance imaging apparatus according to claim 1, wherein
    the first generating circuitry is configured to perform processing including interpolation processing on the first data string, thereby generating the second data string.

6. The magnetic resonance imaging apparatus according to claim 5, wherein
    the first generating circuitry is configured to perform the processing including the interpolation processing according to at least one of a type of a pulse sequence, and a time interval of the first data string that is generated, thereby generating the second data string.

7. The magnetic resonance imaging apparatus according to claim 5, wherein
    the first generating circuitry is configured to generate the second data string based on data that is obtained by performing the interpolation processing on the first data string, and a value of the upper limit value.

8. The magnetic resonance imaging apparatus according to claim 1, wherein
    the first generating circuitry is configured to perform processing including filter processing on the first data string, thereby generating the second data string.

9. The magnetic resonance imaging apparatus according to claim 8, wherein
    the first generating circuitry is configured to perform processing including the filter processing according to at least one of a type of a pulse sequence, and a time interval of the first data string that is generated, thereby generating the second data string.

10. The magnetic resonance imaging apparatus according to claim 1, wherein
    the second generating circuitry is configured to generate a signal of the RF pulse in digital data, then to perform digital-analog conversion, and to output analog data obtained after the digital-analog conversion to the RF amplifier.

* * * * *